(12) United States Patent
Liang et al.

(10) Patent No.: US 10,795,084 B2
(45) Date of Patent: Oct. 6, 2020

(54) GRATING WITH PLURALITY OF LAYERS

(71) Applicant: Hewlett Packard Enterprise Development LP, Houston, TX (US)

(72) Inventors: Di Liang, Santa Barbara, CA (US); Geza Kurczveil, Santa Barbara, CA (US); Raymond G. Beausoleil, Seattle, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/666,053

(22) Filed: Oct. 28, 2019

(65) Prior Publication Data

US 2020/0057198 A1 Feb. 20, 2020

Related U.S. Application Data

(62) Division of application No. 15/963,570, filed on Apr. 26, 2018, now Pat. No. 10,459,133.

(51) Int. Cl.

| | |
|---|---|
| *G02B 6/136* | (2006.01) |
| *G02B 6/124* | (2006.01) |
| *H01S 3/063* | (2006.01) |
| *H01S 3/23* | (2006.01) |
| *H01S 5/10* | (2006.01) |
| *H01S 5/20* | (2006.01) |
| *H01S 5/02* | (2006.01) |
| *G02B 6/12* | (2006.01) |
| *G02B 6/13* | (2006.01) |

(Continued)

(52) U.S. Cl.
CPC ........... *G02B 6/136* (2013.01); *G02B 5/1823* (2013.01); *G02B 6/124* (2013.01); *G02B 6/12004* (2013.01); *G02B 6/13* (2013.01); *H01S 3/063* (2013.01); *H01S 3/2375* (2013.01); *H01S 5/021* (2013.01); *H01S 5/0203* (2013.01); *H01S 5/1057* (2013.01); *H01S 5/2031* (2013.01); *G02B 6/1225* (2013.01); *G02B 27/4272* (2013.01)

(58) Field of Classification Search
None
See application file for complete search history.

(56) References Cited

U.S. PATENT DOCUMENTS

| | | |
|---|---|---|
| 4,512,638 A | 4/1985 | Sriram et al. |
| 4,915,463 A | 4/1990 | Barbee, Jr. |

(Continued)

FOREIGN PATENT DOCUMENTS

JP 01-312821 A 12/1989

OTHER PUBLICATIONS

Dai et al., "Highly efficient and perfectly vertical chip-to-fiber dual-layer grating coupler", Optics Express, vol. 23, No. 2, 2015, pp. 1691-1698.

(Continued)

*Primary Examiner* — Michael Stahl
(74) *Attorney, Agent, or Firm* — Hewlett Packard Enterprise Patent Department

(57) ABSTRACT

A hybrid grating comprises a first grating layer composed of a first solid-state material, and a second grating layer over the first grating layer and composed of a second solid-state material, the second solid state-material being different than the first solid-state material and having a monocrystalline structure.

6 Claims, 8 Drawing Sheets

(51) Int. Cl.
  *G02B 5/18* (2006.01)
  *G02B 6/122* (2006.01)
  *G02B 27/42* (2006.01)

(56) References Cited

U.S. PATENT DOCUMENTS

| | | |
|---|---|---|
| 9,267,822 B1 * | 2/2016 | Rogers ............... G02B 27/4272 |
| 9,407,066 B2 | 8/2016 | Cheng et al. |
| 9,413,139 B2 | 8/2016 | Van et al. |
| 2008/0175294 A1 | 7/2008 | Kim et al. |
| 2011/0150024 A1 | 6/2011 | Dupont et al. |
| 2014/0098833 A1 | 4/2014 | Kim et al. |
| 2014/0198815 A1 | 7/2014 | Chung |
| 2014/0307997 A1 | 10/2014 | Bar et al. |
| 2015/0063753 A1 | 3/2015 | Evans et al. |
| 2016/0327759 A1 | 11/2016 | Keyvaninia et al. |
| 2018/0081114 A1 | 3/2018 | Li et al. |

OTHER PUBLICATIONS

Duan et al., "Hybrid III-V on Silicon Lasers for Photonic Integrated Circuits on Silicon," (Research Paper), vol. 20, No. 4, Jul.-Aug., 2014, 13 pages.

Roelkens et al., "High efficiency Silicon-on-Insulator grating coupler based on a poly-Silicon overlay", Optics Express, vol. 14, No. 24, Nov. 27, 2006, pp. 11622-11630.

* cited by examiner

GRATING WITH PLURALITY OF LAYERS

CROSS-REFERENCE TO RELATED APPLICATIONS

This application is a divisional application of and claims priority to application Ser. No. 15/963,570, filed on Apr. 26, 2018, the contents of which are hereby incorporated by reference in their entireties.

BACKGROUND

Gratings are common components to manipulate light propagation and are widely used in integrated photonics. For example, gratings may be used in grating couplers, in reflectors such as distributed Bragg reflectors (DBRs), and as filters, waveguides, or lenses.

BRIEF DESCRIPTION OF THE DRAWINGS

Certain examples are described in the following detailed description and in reference to the drawings, in which.

DETAILED DESCRIPTION OF SPECIFIC EXAMPLES

Gratings are a fundamental optical component particularly useful for semiconductor photonic integration. However, they are sensitive to fabrication accuracy in various parameters, such as material thickness, grating etch depth, grating period, or alignment. Gratings are equally sensitive to environmental change, e.g., temperature. Fabrication inaccuracies and temperature change may result in problems with various system parameters, such as coupling efficiencies/coefficients, optical bandwidth, or wavelength (e.g., Bragg grating wavelength).

Implementations of the disclosed technology provide hybrid gratings have multiple grating layers coupled through wafer bonding techniques. Such gratings may be highly uniform with precisely controlled parameters using precision techniques such as epitaxial growth and lithography. For example, the hybrid gratings described herein may be able to be produced with greater thicknesses and more uniformity than previous polysilicon gratings, may be efficiently integrated with III-V active photonic components, may be tunable, or may provide vertical grating beam couplers.

As used herein, when a first layer is "over" a second layer, then the first layer may be directly contacting the second layer or there may be one or more intervening layers between the first and second layer. If a first layer is "on" a second layer then the first layer is directly contacting the second layer or there is a bonding material layer between the first layer and the second layer.

Figure 1:
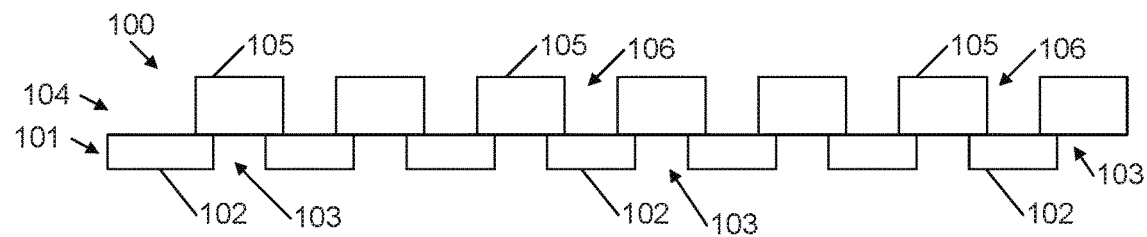
FIG. 1 illustrates a first hybrid grating including two grating layers.

FIG. 1 illustrates a hybrid grating 100 including two grating layers 101 and 104. The first grating layer 101 is composed of a first solid-state material. In some implementations, the first grating layer 101 may be composed of a semiconductor material. In some cases, the first grating layer 101 may be composed of an indirect bandgap material such as Si, Ge or an indirect bandgap III-V material such as AlSb. In other cases, the first grating layer 101 may be composed of a direct bandgap material. For example, grating layer 101 may be composed of a direct bandgap III-V material such as InP, GaN, InAs or GaAs. In various implementations, the first grating layer 101 may have a monocrystalline, polycrystalline structure, or amorphous structure, or may be composed of a glass The first grating layer 101 comprises a plurality of structures 102. In a one-dimensional (1D) grating, the structures 102 may be ridges or rulings. In a two-dimensional (2D) grating, the structures 102 may be rectangular prisms. In various implementations, the structures 102 may rectilinear or curvilinear, or may have any configuration. For example, the grating may be a grating coupler comprising a plurality of rectilinear ridges, or the grating may be focusing grating coupler comprising a plurality of arc-shaped ridges. The structures 102 are separated by a first set of gaps 103. The gaps 103 are complementary to the grating structures 103. For example, in a 1D grating, the gaps 103 are troughs. In a 2D grating, the gaps 103 are rectangular holes. In some implementations, the gaps 103 are filled with air. In other implementations, the gaps 103 are filled with a second material, such as a dielectric material.

The dimensions and spacing of the structures 102 and gaps 103 may depend on the application. For example, the dimensions of the grating layer 101 may depend on whether the grating 100 will be used as a grating coupler, a DBR, a filter, or other application. For example, the first grating layer 101 may be periodic or aperiodic. For example, the first grating may be aperiodic with sufficiently increasing spacing towards the periphery of the grating to provide an apodized beam. In some applications the grating 101 is separated by gaps greater than or equal to ½ the wavelength of the light used in the grating application. In other applications, the grating 101 has subwavelength spacing.

The hybrid grating 100 further comprises a second grating layer 104 over the first grating layer 101. The second grating layer 104 is composed of a second solid-state material different than the first solid state-state material of the first grating layer 101. For example, the second grating layer 104 may be composed of a second semiconductor material different than a first semiconductor material of the first grating layer 101. In some cases, the second grating layer 104 may be composed of an indirect bandgap material such as Si, Ge or an indirect bandgap III-V material such as AlSb. In other cases, the second grating layer 104 may be composed of a direct bandgap material. For example, grating layer 104 may be composed of a direct bandgap III-V material such as InP, GaN, InAs or GaAs. In some implementations, the second grating layer 104 is composed of a different solid-state material than the first grating layer 101. In some implementations, the second grating layer 104 is composed of a monocrystalline layer of solid state material. For example, the second grating layer 104 may be formed from an epitaxially grown semiconductor wafer.

The second grating layer 104 comprises a second plurality of structures 105. In a 1D grating, the structures 105 may be ridges or rulings. In a 2D grating, the structures 105 may be rectangular prisms. In some implementations, the second grating layer 104 has the same dimensionality as the first grating layer 101. For example, the first grating layer 101 and second grating layer 104 may both be 1D gratings or the first and second grating layers 101, 104 may both be 2D gratings. In other implementations, the second grating layer 104 has a different dimensionality compared to the first grating layer 101. For example, if the first grating layer 101 has a 1D structure then the second grating layer has a 2D structure; or if the first grating layer 101 has a 2D structure then the second grating layer 104 has a 1D structure.

The structures 105 are separated by a second set of gaps 106. The gaps 106 are complementary to the grating structures 105. For example, in a 1D grating, the gaps 106 are troughs. In a 2D grating, the gaps 106 are rectangular holes. In some implementations, the gaps 106 are filled with air. In other implementations, the gaps 106 are filled with a second material, such as a dielectric material.

The sizes and spacing of the structures 105 and gaps 106 may depend on the application. For example, the sizes of the grating layer 104 may depend on whether the grating 100 will be used as a grating coupler, a DBR, a filter, or other application. For example, the second grating layer 105 may be periodic or aperiodic. For example, the second grating may be aperiodic with sufficiently increasing spacing towards the periphery of the grating to provide an apodized beam. In some cases, one of the grating layers 101, 104 is periodic while the other one of the grating layers 101, 104 is aperiodic. For example, with a grating 100 used as a grating coupler, the output side of the grating 100 may be aperiodic while the input side of the grating 100 may be periodic. In some applications the grating 104 is separated by gaps greater than or equal to ½ the wavelength of the light used in the grating application. In other applications, the grating 104 has subwavelength spacing.

In some implementations, the first grating layer 101 may have the same or different sizes and spacing compared the second grating layer 104. In some cases, the second grating structures may be taller than the first grating structures 102. For example, the second grating layer 104 may be formed from a monocrystalline material, which may be grown to a greater thickness than a polysilicon first layer 101 while retaining a uniformly planar profile.

In the implementation of FIG. 1, the first set of gaps 103 are unaligned with the gaps 106. In the illustrated implementation, there is a structure 105 of the second layer 104 directly over each gap 103 of the first layer with each structure 105 partially overlapping a neighboring pair of structures 102. In other implementations, the arrangement of the structures 105 may be different. For example, some or all of the structures 105 may partially overlap some or all of the gaps 103. For example, an unaligned hybrid grating 100 may be used to provide a grating beam coupler with a 0° (vertical) to 10° angle of incidence.

Figure 2:
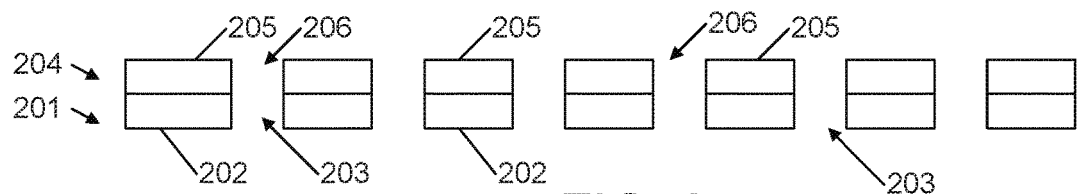
FIG. 2 illustrates a second hybrid grating including two grating layers.

FIG. 2 illustrates a second hybrid grating 200 including two grating layers 201 and 204. The first grating layer 201 comprises a plurality of grating structures 202 separated by gaps 203. The second grating layer 204 comprises a plurality of grating structures 205 separated by gaps 206. The first grating layer 201 including structures 202 and gaps 203, and the second grating layer 204 including structures 205 and gaps 206 may be as described with respect to elements 101, 102, 103, 104, 105, and 106 of FIG. 1, respectively, except that the gaps 206 are aligned with the gaps 203. Accordingly, in this example, the structures 205 and 202 have the same widths and lengths, and may have the same or different heights. Similarly, the gaps 206 and 203 have the same widths and lengths, and may have the same or different depths.

Figure 3:
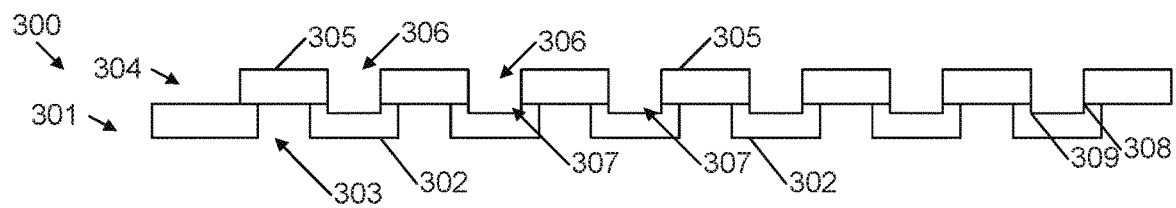
FIG. 3 illustrates a third hybrid grating including two grating layers.

FIG. 3 illustrates a third hybrid grating 300 including two grating layers 301 and 304. The first grating layer 301 may be composed of a first solid-state material as described with respect to grating layer 101. For example, the first grating layer 301 may be composed of a semiconductor material. In some cases, the first grating layer 301 may be composed of an indirect bandgap material such as Si, Ge or an indirect bandgap III-V material such as AlSb. In other cases, the first grating layer 301 may be composed of a direct bandgap material. For example, grating layer 301 may be composed of a direct bandgap III-V material such as InP, GaN, InAs or GaAs. In various implementations, the first grating layer 101 may have a monocrystalline structure or a polycrystalline structure.

The second grating layer 304 may be composed of a second solid-state material as described with respect to grating layer 104. For example, the second grating layer 304 may be composed of a second semiconductor material different than a first semiconductor material of the first grating layer 301. In some cases, the second grating layer 304 may be composed of an indirect bandgap material such as Si, Ge or an indirect bandgap III-V material such as AlSb. In other cases, the second grating layer 104 may be composed of a direct bandgap material. For example, grating layer 104 may be composed of a direct bandgap III-V material such as InP, GaN, InAs or GaAs. In some implementations, the second grating layer 304 is composed of a different solid-state material than the first grating layer 301. In some implementations, the second grating layer 304 is composed for a monocrystalline layer of solid state material. For example, the second grating layer 304 may be formed from an epitaxially grown semiconductor wafer.

The grating first grating layer 301 comprises a first set of structures 302 while the second grating layer 304 comprises a second set of structures 305. The first grating layer 301 further comprises a set of gaps 303 separating the structures 302. The second grating layer 304 further comprises a set of gaps 306 separating the structures 306. The first set of gaps 303 are unaligned with the second set of gaps 306. For example, the relationships between the first set of gaps 303 and the second set of gaps 306 may be as described with respect to gaps 103 and 106 of FIG. 1.

The first grating layer 301 further comprises a third set of gaps 307. The third set of gaps 307 is aligned with second set of gaps 306. Accordingly, the gaps 3070 have the same width and length as the gaps 306. The depth of the gaps 307 may be less than, the same as, or greater than the gaps 303. For example, in FIG. 3 the gaps 307 are shallower than gaps 307, such that the structures 302 include troughs 309 with sidewalls 308. In other implementation, the gaps 307 may extend entirely through the structures 302 (doubling the number of structures 302) into the underlying substrate.

In some implementations, the modal index of the gratings may be tunable. For example, an optical coupler grating in a system with sufficiently narrow bandwidth (such as between 30-40 nm) may be susceptible to thermal instability resulting from the modal index of the grating changing because of environmental thermal changes. A tuner integrated with the grating may avoid or reduce these effects through compensation by varying the modal index of the grating structures.

Figure 4A:
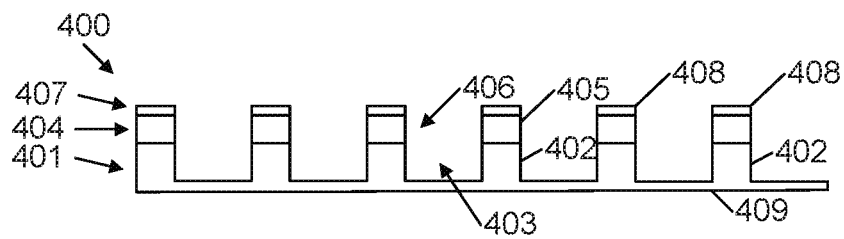
FIG. 4A is a cross-sectional illustration and FIG. 4B is a top-down illustration of an example hybrid grating including a tuner.
Figure 4B:
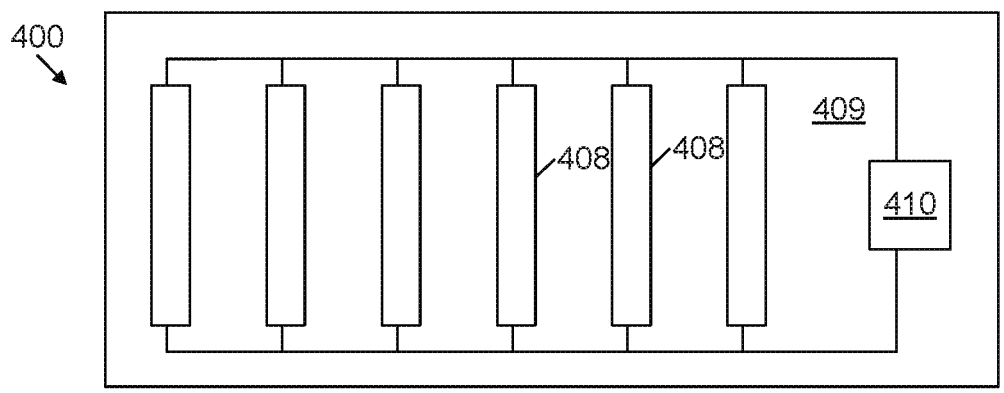

FIG. 4A is a cross-sectional illustration and FIG. 4B is a top-down illustration of an example hybrid grating 400 including a tuner 407, 410. The grating 400 includes a first grating layer 401. The first grating layer 401 comprises a plurality of grating structures 402 separated by gaps 403. The second grating layer 404 comprises a plurality of grating structures 405 separated by gaps 406. The grating layers 401 and 402 may be as described with respect to layers 201 and 202 of FIG. 2. The hybrid grating 400 is disposed over a substrate 409. In some cases, the substrate 409 may be composed of the same material as the structures 402. In other implementations, the first grating layer 401 and second grating layer 404 may be unaligned as in FIG. 1 or may include aligned and unaligned portions as in FIG. 3.

The hybrid grating 400 further comprises a tuner 407, 410, comprising a heater material layer 407 and a driver 410. For example, the heater material layer 407 may comprise a plurality of conductive layers 408 disposed on the structures. For example, the conductive layers 408 may be metal layers, such as chromium or tungsten. The driver may comprise a voltage source 410 coupled to the metal layers 408. The metal layers 408 are heated according to the voltage applied by the driver 410 and their resistance. When heated, the metal layers 408 heat the underlying structures 405, causing a variance in the modal index of the structures 405, and the hybrid grating 400 as a whole. In other implementations, the heater material layer 407 may be disposed between the first layer 401 and second layer 404, and may heat both the first structures 402 and second structures 405. In still further implementations, the heater material layer 407 may be omitted and the structures 405, 402, or both may be lightly doped such that they are subject to resistive heating when a voltage is applied across them by driver 410.

Figure 5:
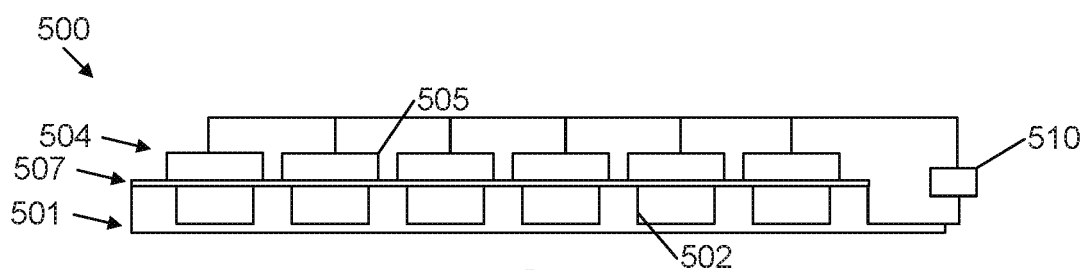
FIG. 5 illustrates a second example tunable hybrid grating.

FIG. 5 illustrates a second example tunable hybrid grating 500. The grating 500 includes a first grating layer 501 comprising a plurality of grating structures 502. The grating further includes a second grating layer 504 comprising a plurality of grating structures 505. The first and second grating layers 501, 504 may be composed of semiconductor materials as described with respect to layers 101 and 104 of FIG. 1, respectively. In the illustrated example, the structures 502 and 505 are unaligned as in FIG. 1. In other implementations, the structures 502 and 505 may be aligned as in FIG. 2 or may include aligned and unaligned portions as in FIG. 3.

The grating 500 further comprises a tuner 510 coupled to the grating layers 504 and 501. In this implementation, one of the two grating layers is n-type doped and the other of two grating layers is p-type doped, and thin layer of oxide material 507, such as aluminum oxide or hafnium oxide is between the two layers. Application of a voltage across the layers 504 and 501 induces a change in the modal index of the grating.

Figure 6:
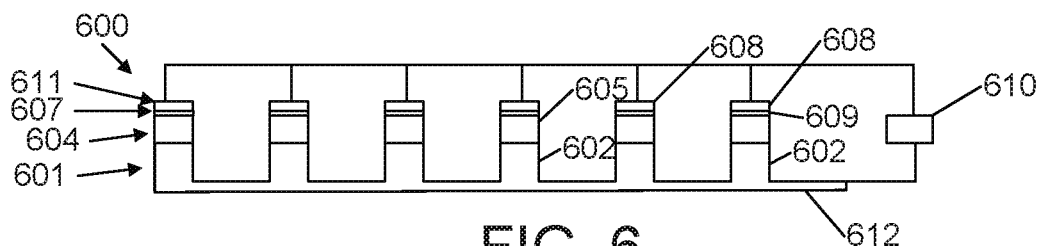
FIG. 6 illustrates a third example tunable hybrid grating.

FIG. 6 illustrates a third example tunable hybrid grating 600. The tunable grating 600 includes a first grating layer 601 comprising a plurality of grating structures 602. The grating further includes a second grating layer 604 comprising a plurality of grating structures 605. The first and second grating layers 601, 604 may be composed of semiconductor materials as described with respect to layers 101 and 104 of FIG. 1, respectively. In the illustrated example, the structures 602 and 605 are aligned as in FIG. 2. In other implementations, the structures 602 and 605 may be unaligned as in FIG. 1 or may include aligned and unaligned portions as in FIG. 3.

The grating 600 further comprises a metal oxide semiconductor (MOS) tuner. The MOS tuner comprises a metal layer 611 and an oxide layer 607 disposed over the structures 605. Accordingly, each structure 605 has a corresponding oxide layer 609 deposited on it, and each oxide layer 609 has a metal contact 608 deposited on it. In the illustrated implementation, both layers 604 and 601 are p-type or n-type doped and the substrate 612 is connected to the voltage source 610. Application of a voltage across the MOS structures induces a change in the modal index of the grating.

Figure 7:
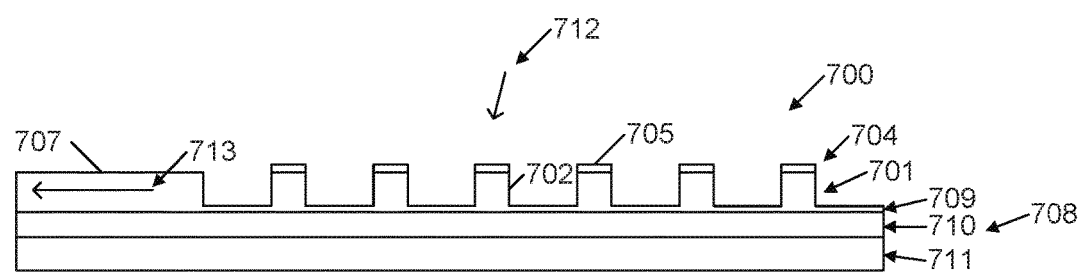
FIG. 7 illustrates an example photonic component.

FIG. 7 illustrates an example photonic component. For example, the component may be an active silicon device such as an optical transmitter or optical receiver and may include components such as lasers, amplifiers, photodetectors, optical modulators, and optical multiplexors or demultiplexors. The illustrated example includes a hybrid grating 700 acting as a grating coupler for an incoming light beam 712 and a waveguide 707 to transport the light 713 elsewhere in the component.

The hybrid grating 700 and waveguide 707 are formed on a semiconductor on insulator substrate 708. The substrate comprises a first semiconductor layer 711, an insulating layer 710, and a second semiconductor layer 709. For example, the substrate 708 may be a silicon-on-insulator (SOI) substrate. In some implementations, the insulating layer 710 is a buried oxide (BOX) layer and may be composed of silicon dioxide or another insulting oxide material. In other implementations, the insulating layer 710 is composed of another insulating material such as sapphire or diamond.

The grating 700 includes a first grating layer 701 comprising a plurality of grating structures 702. The grating further includes a second grating layer 704 comprising a plurality of grating structures 705. The first and second grating layers 701, 704 may be composed of semiconductor materials as described with respect to layers 101 and 104 of FIG. 1, respectively. For example, the first grating layer 701 may be composed of silicon and the second grating layer 704 may be composed of a III-V material. In the illustrated example, the structures 702 and 705 are aligned as in FIG. 2. In other implementations, the structures 702 and 705 may be unaligned as in FIG. 1 or may include aligned and unaligned portions as in FIG. 3.

In grating couplers, directionality and coupling efficiency may be improved by when the grating is higher than the corresponding waveguide. Typically, this is accomplished by selective removal of an upper portion of the waveguide, for example, through etching and polishing. However, such processes may difficult to perform precisely and with desired uniformity. In the illustrated implementation, the waveguide 707 and first grating layer 701 may be same height. The second grating layer 704 is high enough to provide improved directionality and coupling efficiency without requiring removal of waveguide material. For example, the waveguide and first layer may be between 180 nm to 300 nm [INSERT TYPICAL HEIGHTS] while the second layer may be between 100 nm to 200 nm[INSERT TYPICAL HEIGHTS]. For example, this may allow the grating to operate with angle of incidence of the incoming beam 712 of between 9° and 11°.

Figure 8:
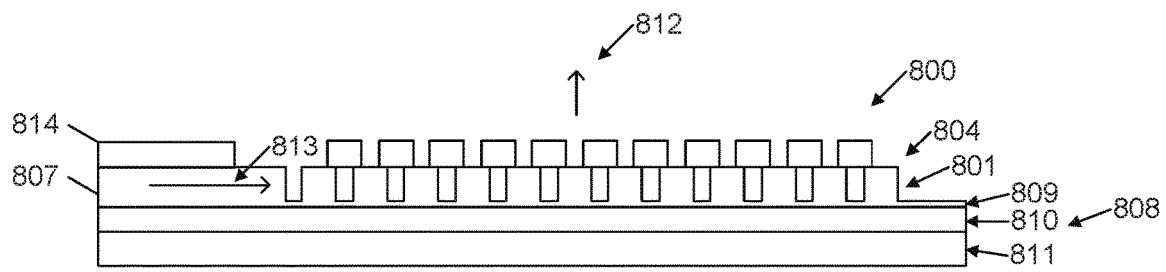
FIG. 8 illustrates an example photonic component including an active photonic device and an unaligned hybrid grating.

FIG. 8 illustrates an example photonic component including an active photonic device 814 and an unaligned hybrid grating 800. For example, the active photonic device 814 may be a comb laser emitting an optical output 813 comprising a plurality of laser wavelengths across a particular bandwidth. The active photonic device 814 may include further devices, such as modulators, and amplifiers to generate an optical signal carrying data. The hybrid grating 800 may be implemented as an output grating coupler to output the optical signal 812 off chip, for example, to an optical fiber or other chip.

The grating 800 includes a first grating layer 801 comprising a plurality of grating structures 802. The grating further includes a second grating layer 804 comprising a plurality of grating structures 805. The first and second grating layers 801, 804 may be composed of semiconductor materials as described with respect to layers 101 and 104 of FIG. 1, respectively. For example, the first grating layer 801 may be composed of silicon and the second grating layer 804 may be composed of a III-V material. In the illustrated example, the structures 802 and 805 are unaligned as in FIG. 1. For example, an unaligned upper grating layer 804 be designed to provide a uniform output beam across an entire comb laser bandwidth with a desired directionality. Some implementations may be configured to provide a vertical or near vertical output beam 812 (i.e., less than 5° output angle with respect to vertical). In other implementations, the structures 802 and 805 may be aligned as in FIG. 2 or may include aligned and unaligned portions as in FIG. 3.

The component further includes a passive silicon waveguide 807. The waveguide 807 and first grating layer 801 may be formed out of a common upper silicon layer 809 of a silicon on insulator substrate 808. The SOI substrate 808 may be similar to the substrate 708 of FIG. 7, and may include a lower semiconductor layer 811, a middle insulator layer 810, and an upper semiconductor layer 809. For example, the substrate 808 may be composed of the same materials as substrate 708 of FIG. 7.

The active photonic device 814 and upper grating layer 804 may be formed from a common material layer. For example, the device 814 and grating layer 804 may be formed from an epitaxially grown III-V material bonded to the silicon waveguide 807 and grating 801.

Figure 9:
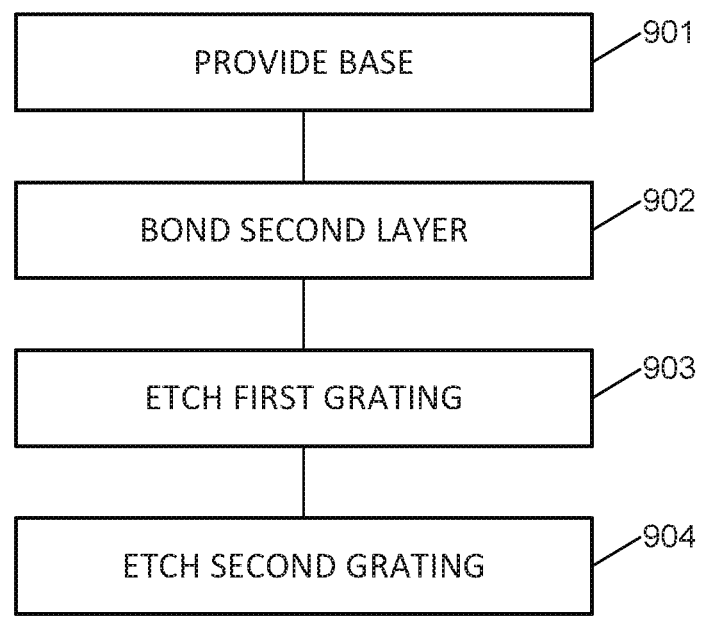
FIG. 9 illustrates an example method of manufacturing a hybrid grating.
Figure 10:
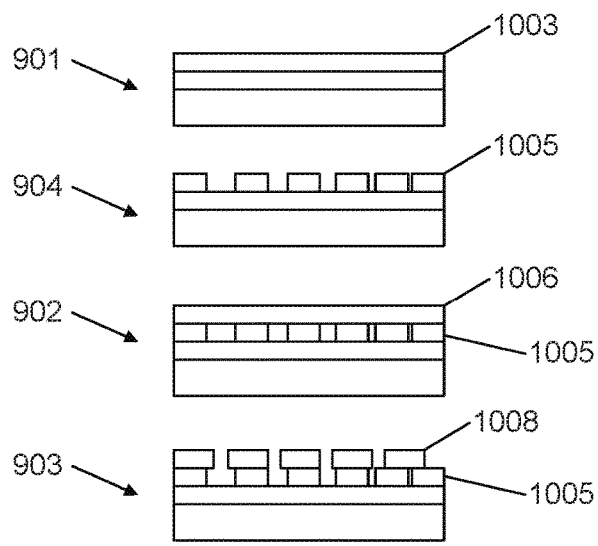
FIG. 10 illustrates an example of using the method of FIG. 9 to manufacture a hybrid grating including unaligned grating layers as described with respect to FIG. 1.
Figure 11:
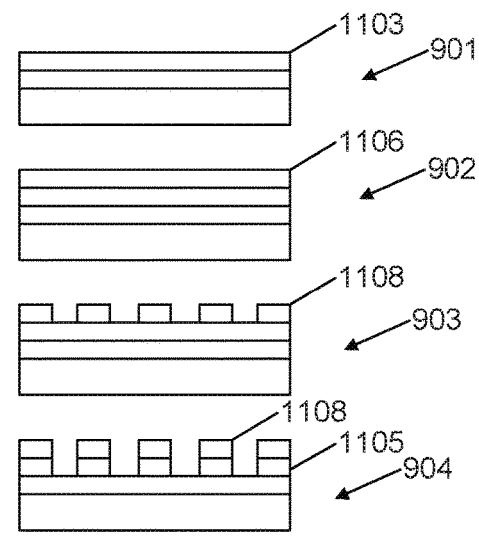
FIG. 11 illustrates an example of using the method of FIG. 9 to manufacture a hybrid grating including aligned grating layers as described with respect to FIG. 2.
Figure 12:
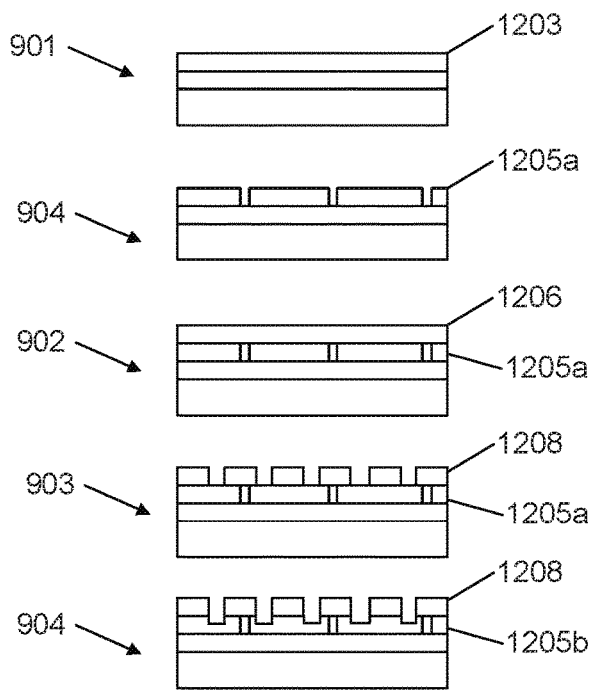
FIG. 12 illustrates an example using the method of FIG. 9 to manufacture a hybrid grating where the first grating includes portions that are unaligned and portions that are aligned with the second grating.

FIG. 9 illustrates an example method of manufacturing a hybrid grating. For example, the method may be used to manufacture any of the hybrid gratings illustrated in FIGS. 1-6 or used in FIGS. 7-8. The steps of FIG. 9 may be performed in various orders depending on the type of hybrid grating being manufactured. FIGS. 10-12 illustrate various process flows for manufacturing the gratings of FIGS. 1-3, respectively.

The method includes block 901. Block 901 comprises providing a base comprising a first solid-state material layer. The base may be a substrate as described above. For example, the base may be a silicon on insulator substrate such as the substrate 708 described with respect to FIG. 7 and the first solid-state material layer may be composed as described with respect to the compositions of any of the first grating layers described with respect to FIGS. 1-8. For example, the first solid-state material layer may be a polycrystalline material layer.

The method further includes block 902. Block 902 comprises bonding a monocrystalline, second solid-state material layer different from the first solid-state material layer over the first solid-state material layer. The second solid-state material layer be composed as described with respect to the compositions of any of the second grating layers described with respect to FIGS. 1-8. For example, the second solid-state material layer may be a monocrystalline III-V material layer.

The method further includes block 903. Block 903 comprises etching a first grating into the first solid-state material layer. For example, block 903 may comprise etching the first solid-state material layer to form a first grating. For example, the first grating may be dimensioned and configured as described with respect to any of the first grating layers described with respect to FIGS. 1-8. Various etching processes may be used in different implementations. For example, a dry or a wet etch process may be employed, and the etch process may be isotropic or anisotropic.

The method further includes block 904. Block 904 comprises etching a second grating into the second solid-state material layer. For example, block 904 may comprise etching the second solid-state material layer to form a second grating. For example, the second grating may be dimensioned and configured as described with respect to any of the second grating layers described with respect to FIGS. 1-8. Various etching processes may be used in different implementations. For example, a dry or a wet etch process may be employed, and the etch process may be isotropic or anisotropic. The etch process used to form the second grating may be the same as or different than the etch process used to form the first grating.

The steps of FIG. 9 may be performed in various orders depending on the type of hybrid grating being manufactured. FIGS. 10-12 illustrate various process flows for manufacturing the gratings of FIGS. 1-3, respectively.

FIG. 10 illustrates an example of using the method of FIG. 9 to manufacture a hybrid grating including unaligned grating layers as described with respect to FIG. 1.

First, block 901 is performed to provide a base including a first solid-state material layer 1003. For example, the base may be a SOI substrate including an upper polysilicon layer. As another example, the upper layer may be composed of amorphous silicon or glass.

Second, block 904 is performed to etch the first grating 1005 with the desired dimensionality. For example, in the illustrated implementation, the first grating 1005 is aperiodic to provide an apodized beam and has a depth extending to the buried oxide layer of the SOI substrate.

Third, block 902 is performed to bond a monocrystalline, second solid-state material layer 1006 different from the first solid-state material layer over the first solid-state material layer (after etching, grating 1005). For example, the second layer may comprise a monocrystalline, epitaxially grown, III-V material layer.

Fourth, block 903 is performed to etch the second grating 1008 with the desired dimensionality. For example, in the illustrated implementation, the second grating 1008 is periodic with a depth extending to the first grating 1005.

In this example, the grating layers will be unaligned, so the etching process of block 903 is to stop at the bottom of the upper layer. Various techniques may be utilized to prevent continued etching beyond grating 1008. For example, a layer of etch stop material may be disposed between the first and second material layers. For example, the base provided in block 901 may have an upper layer of etch stop on the first material layer 103, the second layer provided in block 902 may have a lower layer of etch stop below the second material layer 1006, or block 904 may include depositing a coating of etch stop over the first grating.

FIG. 11 illustrates an example of using the method of FIG. 9 to manufacture a hybrid grating including aligned grating layers as described with respect to FIG. 2.

First, block 901 is performed to provide a base including a first solid-state material layer 1103. For example, the base may be a SOI substrate including an upper polysilicon layer.

Second, block 902 is performed to bond a monocrystalline, second solid-state material layer 1006 different from the first solid-state material layer 1103 over the first solid-state material layer 1103. For example, the second layer may comprise a monocrystalline, epitaxially grown, III-V material layer.

Third, block 903 is performed to etch the second grating 1108 with the desired dimensionality. For example, in the illustrated implementation, the second grating 1108 is periodic with a depth extending to the first solid-state material layer 1103.

Fourth, block 904 is performed to etch the first grating 1005 with the desired dimensionality. For example, the same etch process used in block 903 may be continued to extend the depth of the etched trenches into the first layer 1103. As another example, a different etch process (for example, using etching processes selected according to the material used for layer 1103) is used to continue etching the aligned first grating 1105.

FIG. 12 illustrates an example using the method of FIG. 9 to manufacture a hybrid grating where the first grating includes portions that are unaligned and portions that are aligned with the second grating, such as the grating described with respect to FIG. 3.

First, block 901 is performed to provide a base including a first solid-state material layer 1203. For example, the base may be a SOI substrate including an upper polysilicon layer.

Second, block 904 is performed to etch a first set of structures 1205*a* of the first grating. These structures 1205 will be unaligned with the second grating.

Third, block 902 is performed to bond a monocrystalline, second solid-state material layer 1206 different from the first solid-state material layer over the first solid-state material layer (after etching, grating 1205*a*). For example, the second layer may comprise a monocrystalline, epitaxially grown, III-V material layer.

Fourth, block 903 is performed to etch the second grating 1208 with the desired dimensionality. For example, in the illustrated implementation, the second grating 1208 is periodic with a depth extending to the first grating 1205*a*.

Fifth, block 904 is performed again to etch a second set of structures into the grating 1205*a* to for the final second grating 1205*b*. For example, the same etch process used in block 903 may be continued to extend the depth of the etched trenches into the first layer 1205*a*. As another example, a different etch process (for example, using etching processes selected according to the material used for layer 1205*a*) is used to continue etching the aligned structures of the final second grating 1205*b*.

Figure 13:
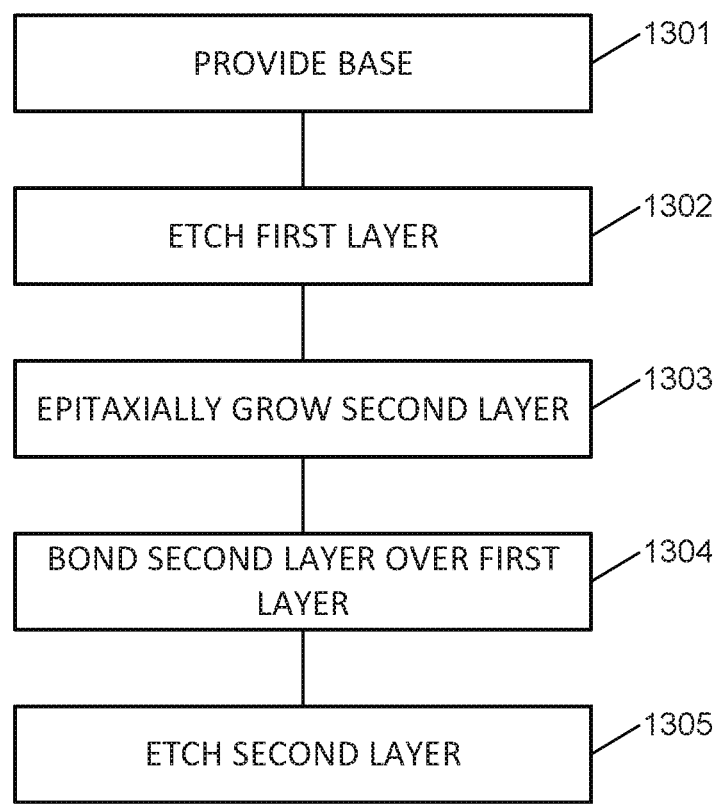
FIG. 13 illustrates an example method of manufacturing a hybrid grating.

FIG. 13 illustrates an example method of manufacturing a hybrid grating. For example, the method may be used to manufacture any of the hybrid gratings illustrated in FIGS. 1-6 or used in FIGS. 7-8. Additionally, the illustrated steps may be performed in any order and repeated to perform the process flows illustrated in FIGS. 10-12.

Block 1301 comprises providing a base comprising a first solid-state material layer. The base may be a substrate as described above. For example, the base may be a silicon on insulator substrate such as the substrate 708 described with respect to FIG. 7 and the first solid-state material layer may be composed as described with respect to the compositions of any of the first grating layers described with respect to FIGS. 1-8. For example, the first solid-state material layer may be a polycrystalline material layer.

Block 1302 comprises etching a first grating into the first solid-state material layer. For example, block 1302 may be performed as described with respect to block 903 of FIG. 9.

Block 1303 comprises epitaxially growing a second semiconductor material layer. For example, block 1303 may comprise epitaxially growing a layer of monocrystalline III-V material. As described above, the second layer may be grown to the desired height of the second grating layer. This allows the second grating layer to have a planar surface and a precisely controlled height without planarization or etching.

Block 1304 comprises bonding the second layer over the first layer. For example, block 1304 may comprise bonding the second layer to the first layer using wafer bonding techniques.

Block 1305 comprises etching the second layer to form the second grating layer with the desired dimensionality.

Figure 14:
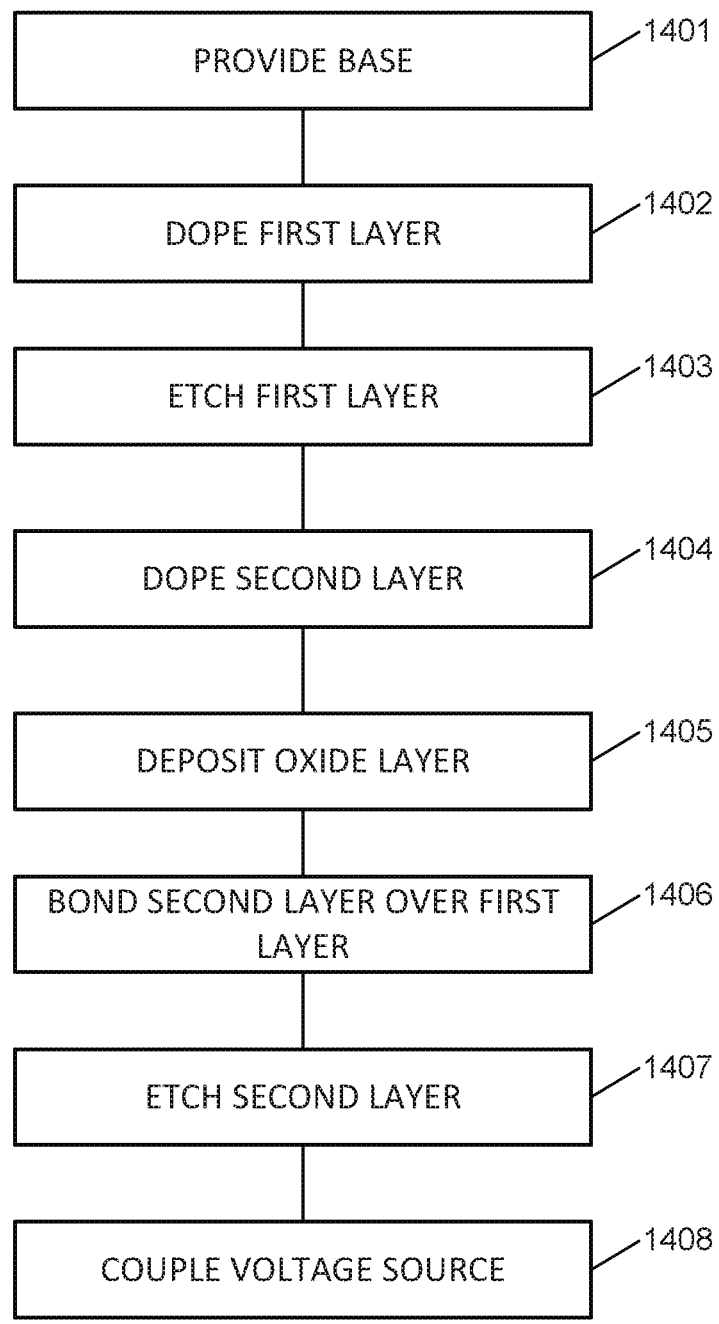
FIG. 14 illustrates an example method of manufacturing a tunable hybrid grating.

FIG. 14 illustrates an example method of manufacturing a tunable hybrid grating. For example, the illustrated method may be used to manufacture a tunable hybrid grating including doped layers, such as the grating illustrated in FIGS. 4A & 4B or FIG. 5. The illustrated steps may be performed in any order and repeated as needed depending on the type of hybrid grating being manufactured (e.g., depending on whether the grating will be aligned or unaligned, depending on if and where an oxide layer will be deposited, and when in the manufacturing process doping will be performed).

Block 1401 comprises providing a base comprising a first solid-state material layer. The base may be a substrate as described above. For example, the base may be a silicon on insulator substrate such as the substrate 708 described with respect to FIG. 7 and the first solid-state material layer may be composed as described with respect to the compositions of any of the first grating layers described with respect to FIGS. 1-8. For example, the first solid-state material layer may be a polycrystalline material layer.

Block 1402 comprises doping the first solid-state material layer. For example, block 1402 may comprise lightly n- or p-type doping the first solid-state material layer for a resistive heating hybrid grating. As another example, block 1402 may comprise heavily n- or p-type doping the first layer for manufacturing a grating as described in FIG. 5 or FIG. 6.

Block 1403 comprises etching the first grating layer into the first solid-state material layer. For example, block 1403 may be performed as described with respect to block 903 of FIG. 9.

Block 1404 comprises doping a second solid-state material layer. As described above, the second solid-state material layer may be doped with the same dopant as the first material layer (i.e., both may be p- or n-type doped), or the second solid state-material layer may be doped in the opposite way as the first material layer (i.e., if the first layer is p-typed, then the second material layer is n-typed, and vice versa). Additionally, the second solid-state material layer may be lightly or heavily doped. In some implementations, block 1404 may comprise incorporating the dopant into the second layer during an epitaxial growth process. As another example, block 104 may comprise impregnating the second layer with the dopant.

The illustrated method includes block 1405, which comprises depositing an oxide layer over the first layer. The step may be performed if manufacturing the tunable hybrid grating of FIG. 5. This step may be omitted if manufacturing a different type of tunable hybrid grating. Additionally, this step may be performed to deposit an oxide layer over the second material layer if manufacturing a tunable hybrid grating of FIG. 6.

Block 1406 comprises bonding the second layer over the first layer. For example, block 1046 may comprise bonding the second layer to the oxide layer deposited on first layer using wafer bonding techniques. As another example, block 106 may comprise bonding the second layer to the first solid-state material layer using wafer bonding techniques (if the oxide is not deposited on the first solid-state material layer).

Block 1407 comprises etching the second layer to form the second grating layer with the desired dimensionality.

Block 1408 comprises coupling a voltage source to the tunable grating. For example, in an implementation where the oxide layer is deposited between the solid-state material layers, block 1408 may comprise coupling the voltage source to the first and second material layers to enable application of a voltage across the layers. In an implementation where the oxide layer is deposited on the second solid-state material layer, block 1408 may comprise coupling the voltage source to the oxide layer and the first solid-state material to enable application of a voltage across the layers.

Figure 15:
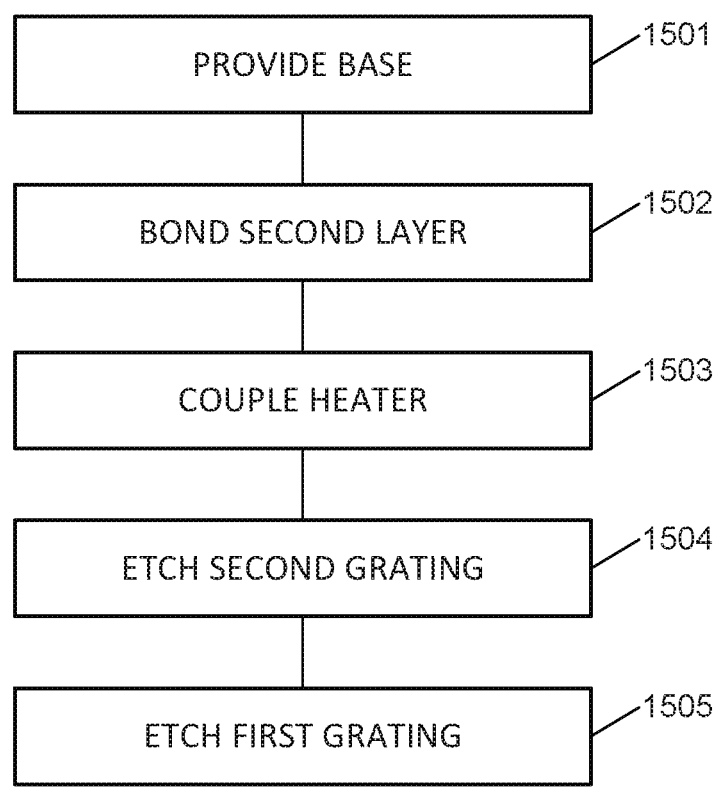
FIG. 15 illustrates an example of manufacturing a tunable hybrid grating including a heater.

FIG. 15 illustrates an example of manufacturing a tunable hybrid grating including a heater. For example, the method may be used to manufacture a tunable hybrid grating of the type described with respect to FIG. 4. Although the Figure is described according to the manufacture of an aligned hybrid grating, the illustrated steps may be performed in any order and repeated as needed depending on the type of hybrid grating being manufactured (e.g., depending on whether the grating will be aligned or unaligned).

Block 1501 comprises providing a base comprising a first solid-state material layer. The base may be a substrate as described above. For example, the base may be a silicon on insulator substrate such as the substrate 708 described with respect to FIG. 7 and the first solid-state material layer may be composed as described with respect to the compositions of any of the first grating layers described with respect to FIGS. 1-8. For example, the first solid-state material layer may be a polycrystalline material layer.

Block 1502 comprises the second layer over the first layer. For example, block 1502 may comprise bonding the second layer to the oxide layer deposited on first layer using wafer bonding techniques. Block 1503 comprises coupling a heater to the second layer. For example, block 1503 may comprise depositing a resistive heating material such as copper over the second layer. Block 1503 may further include coupling a driver to the heating material layer.

Block 1504 comprises etching the second layer to form the second grating layer with the desired dimensionality. Block 1505 comprises etching the first layer to form the first grating layer with the desired dimensionality. For example, block 1505 may comprise continuing to etch past the second grating into the first solid-state material layer to form the first grating layer.

While the various hybrid gratings described above comprise two different grating layers, further implementations may comprise more grating layers. For example, further solid-state material layers may be stacked to form hybrid gratings of any number of layers. Such further grating layers may be aligned or unaligned with gratings layers directly above or below them. Additionally, some or all of such additional grating layers may be doped to provide tunable layers as described above. Various other material layers, such as oxide layers or heating material layers may be interposed between the additional layers, and voltage sources or drivers may be connected to these layers as needed to enable the tuning. The method steps described with respect to FIG. 9-14 may be repeated in any order as needed to manufacture such hybrid gratings including more than two grating layers.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

The invention claimed is:

1. A method, comprising:
providing a base comprising a first solid-state material layer;
bonding a monocrystalline, second solid-state material layer different from the first solid-state material layer over the first solid-state material layer;
etching a first grating into the first solid-state material layer;
etching a second grating into the second solid-state material layer; and
etching the first grating by etching through the second layer to form the second grating and continuing to etch into the first layer to form the first grating.

2. The method of claim 1, further comprising:
etching the first grating into the first layer before bonding the second layer over the first layer.

3. A method, comprising:
providing a base comprising a first solid-state material layer;
bonding a monocrystalline, second solid-state material layer different from the first solid-state material layer over the first solid-state material layer;
etching a first grating into the first solid-state material layer;
etching a second grating into the second solid-state material layer;
etching a first portion of the first grating into the first layer before bonding the second material layer over the first layer; and
etching a second portion of the first grating by etching through the second layer and continuing to etch into the first layer.

4. The method of claim 1, further comprising epitaxially growing the second layer.

5. A method, comprising:
providing a base comprising a first solid-state material layer;
bonding a monocrystalline, second solid-state material layer different from the first solid-state material layer over the first solid-state material layer;
etching a first grating into the first solid-state material layer;
etching a second grating into the second solid-state material layer;

wherein the first layer comprises a silicon layer and second layer comprises a III-V material layer, and further comprising:
  doping the silicon layer with one of an n-type or p-type dopant;
  doping the III-V material layer with the other one of the n-type or p-type dopant;
  depositing an oxide layer on the silicon layer and bonding the III-V material layer on the oxide layer; and
  coupling a voltage source to the silicon layer and the III-V material layer.

6. The method of claim 1, wherein the first layer comprises a silicon layer and second layer comprises a III-V material layer, and further comprising:
  doping the silicon layer with one of an n-type or p-type dopant;
  doping the III-V material layer with the one of the n-type or p-type dopant;
  depositing an oxide layer on the III-V material layer and bonding the oxide layer on the doped silicon layer; and
  coupling a voltage source to the silicon layer and the oxide layer.

* * * * *